(12) United States Patent
Lee et al.

(10) Patent No.: US 11,114,598 B2
(45) Date of Patent: Sep. 7, 2021

(54) LAMP USING SEMICONDUCTOR LIGHT-EMITTING ELEMENTS

(71) Applicant: LG ELECTRONICS INC., Seoul (KR)

(72) Inventors: Kyungho Lee, Seoul (KR); Sungwhan Lee, Seoul (KR); Hooyoung Song, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/964,883

(22) PCT Filed: Apr. 13, 2018

(86) PCT No.: PCT/KR2018/004348
§ 371 (c)(1),
(2) Date: Jul. 24, 2020

(87) PCT Pub. No.: WO2019/146842
PCT Pub. Date: Aug. 1, 2019

(65) Prior Publication Data
US 2021/0043819 A1    Feb. 11, 2021

(30) Foreign Application Priority Data

Jan. 26, 2018 (KR) .......... 10-2018-0010191

(51) Int. Cl.
*F21S 41/141*    (2018.01)
*H01L 33/62*    (2010.01)
(Continued)

(52) U.S. Cl.
CPC .......... *H01L 33/62* (2013.01); *H01L 25/0753* (2013.01); *H01L 33/42* (2013.01);
(Continued)

(58) Field of Classification Search
None
See application file for complete search history.

(56) References Cited

FOREIGN PATENT DOCUMENTS

| JP | 2011-86758 A | 4/2011 |
|---|---|---|
| JP | 2011-205106 A | 10/2011 |

(Continued)

*Primary Examiner* — Vip Patel
(74) *Attorney, Agent, or Firm* — Birch, Stewart, Kolasch & Birch, LLP

(57) ABSTRACT

Discussed is a lamp or a lighting device including a wiring substrate; a bus electrode provided on the wiring substrate; a plurality of electrode lines provided on the wiring substrate, and extending from the bus electrode, each electrode line having one end and a central portion located between the one end and the bus electrode; a plurality of semiconductor light-emitting elements aligned along an extending direction of the plurality of electrode lines, and disposed to be spaced apart from adjacent electrode lines of the plurality of electrode lines by varying distances, respectively; and a plurality of transparent electrodes that respectively provide an electrical connection between the plurality of electrode lines and the plurality of semiconductor light-emitting elements, wherein the respective varying distances between the plurality of semiconductor light-emitting elements and each of the adjacent electrode lines decrease toward the central portion of the each electrode line.

20 Claims, 9 Drawing Sheets

(51) Int. Cl.
*H01L 25/075* (2006.01)
*H01L 33/42* (2010.01)
*F21Y 115/10* (2016.01)
*F21W 102/30* (2018.01)
*F21S 43/14* (2018.01)

(52) U.S. Cl.
CPC .............. *F21S 41/141* (2018.01); *F21S 43/14* (2018.01); *F21W 2102/30* (2018.01); *F21Y 2115/10* (2016.08)

(56) References Cited

FOREIGN PATENT DOCUMENTS

| | | |
|---|---|---|
| JP | 2012-15467 A | 1/2012 |
| JP | 2013-62279 A | 4/2013 |
| KR | 10-2012-0021901 A | 3/2012 |

LAMP USING SEMICONDUCTOR LIGHT-EMITTING ELEMENTS

CROSS REFERENCE TO RELATED APPLICATIONS

This application is the National Stage filing under 35 U.S.C. 371 of International Application No. PCT/KR2018/004348, filed on Apr. 13, 2018, which claims the benefit of earlier filing date and right of priority to Korean Application No. 10-2018-0010191, filed in the Republic of Korea on Jan. 26, 2018, the contents of all these applications are hereby incorporated by reference herein in their entirety.

TECHNICAL FIELD

The present disclosure relates to a lamp using semiconductor light-emitting elements, and more particularly, a lamp with high light uniformity.

BACKGROUND

Lamps that emit light are used in various fields. For example, a vehicle is equipped with various lamps having lighting functions and signaling functions. Referring to FIG. 1, a lamp device (vehicle lamp) 10 is provided in a vehicle 1 to increase illumination for improving visibility of the vehicle 1 and to indicate a driving state of the vehicle 1 to other vehicles.

A vehicle or automotive lamp device includes a headlamp installed at the front of a vehicle and a rear lamp installed at the rear of the vehicle. The headlamp provides forward illumination during night driving. The rear lamp includes a stop (or brake) lamp turned on when the brake is pressed, and a turn signal lamp (or direction-indicator lamp) that indicates a proceeding direction of the vehicle.

Halogen lamps or gas discharge lamps have been usually used, but in recent years, light emitting diodes (LEDs) are in the spotlight as light sources for automotive lamps.

The LEDs can enhance a degree of freedom for design of a lamp by minimizing a size thereof and exhibit economical efficiency by virtue of a semi-permanent lifespan, but most of the LEDs are currently produced in a form of a package. The LED itself other than the package is under development as a semiconductor light-emitting element (or device) of converting a current into light, namely, an image displaying light source used in an electronic device such as an information communication device.

However, automotive lamps developed to date use LEDs in the package form, and thus have disadvantages, such as a low mass production yield rate, high fabrication costs, and low flexibility.

Meanwhile, a lamp using semiconductor light-emitting elements may have various areas. When the lamp has a large area, a voltage is not evenly or uniformly applied to individual elements, thereby leading to a decrease in light uniformity.

DISCLOSURE

Technical Problem

One aspect of the present disclosure is to provide a structure that can apply a uniform voltage to semiconductor light-emitting elements provided in a lamp.

Technical Solution

Embodiments disclosed herein provide a lamp that may include a wiring substrate, a bus electrode provided on the wiring substrate, a plurality of electrode lines provided on the wiring substrate, extending from the bus electrode and each having one end, a plurality of semiconductor light-emitting elements aligned along a direction that the electrode lines are formed and disposed to be spaced apart from adjacent electrode lines by a predetermined distance, and a plurality of transparent electrodes that provides electrical connection between the electrode lines and the semiconductor light-emitting elements. The distance between the semiconductor light-emitting elements and each of the electrode lines may decrease toward a central portion of the electrode line.

In one embodiment, the distance between the electrode lines and the semiconductor light-emitting elements may increase toward the bus electrode or the one end.

In one embodiment, a width of each of the electrode lines may increase toward the central portion thereof.

In one embodiment, each of the electrode lines may include a plurality of protrusions protruding perpendicular to a direction that the electrode line is formed.

In one embodiment, a length of each of the protrusions may increase toward the central portion of the electrode line.

In one embodiment, the transparent electrode may be electrically connected to the protrusion and extend in a protruding direction of the protrusion so as to be electrically connected to the semiconductor light-emitting element.

In one embodiment, a length of each of the protrusions may be greater than the distance between the electrode line and the semiconductor light-emitting element.

In one embodiment, the transparent electrode may be electrically connected to the protrusion and extend in a direction that the electrode line is formed so as to be electrically connected to the semiconductor light-emitting element.

In one embodiment, the bus electrode may include a first bus electrode and a second bus electrode, and the first and second bus electrodes may be inclined with respect to each other.

In one embodiment, the electrode line may include a first electrode line extending from the first bus electrode and a second electrode line extending from the second bus electrode. The first electrode line may protrude in a direction perpendicular to the first bus electrode, and the second electrode line may protrude in a direction inclined to the second bus electrode.

Advantageous Effects

According to at least one of the embodiments of the present disclosure, a uniform voltage is applied to semiconductor light-emitting elements provided in a lamp, each of the semiconductor light-emitting elements provided in the lamp can emit light with the same brightness.

BEST MODE OF CARRYING OUT EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A lamp disclosed herein may include a mobile phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it will be readily apparent to those skilled in the art that the configuration according to the embodiments described herein may also be applied to a new product type that will be developed later if it is a lamp.

Meanwhile, the lamp described in this specification may be used in a vehicle. Vehicle lamps may include a headlamp, a tail lamp, a position lamp, a fog lamp, a turn signal lamp, a stop (or brake) lamp, an emergency lamp, a backup lamp, and the like.

Figure 1:
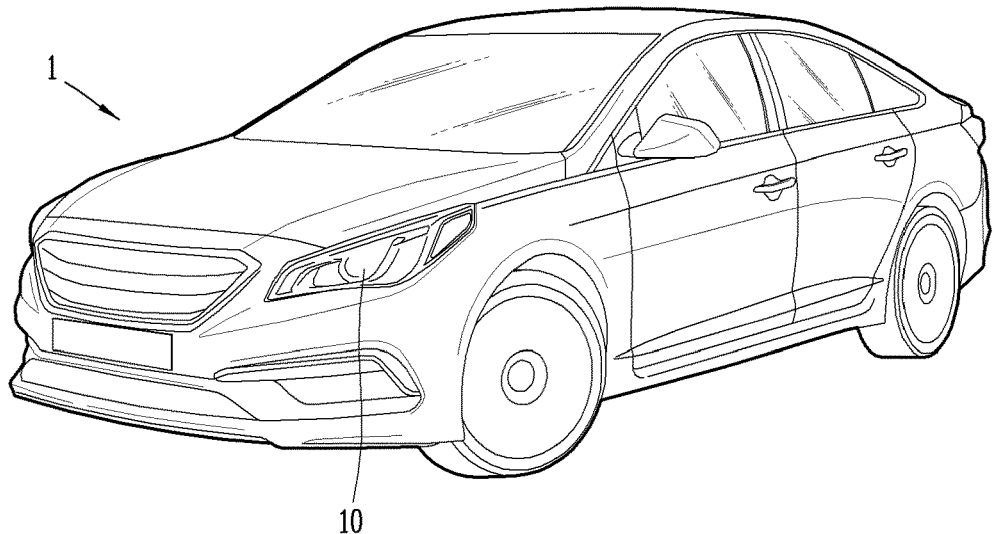
FIG. 1 is a conceptual view of a vehicle.
Figure 2:
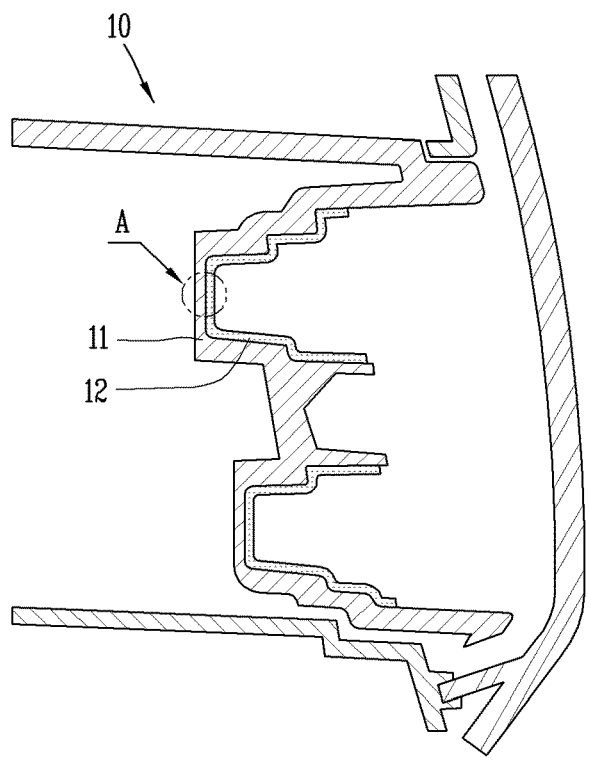
FIG. 2 is a cross-sectional view of a lamp included in a vehicle.

FIG. 2 is a cross-sectional view of a lamp included in a vehicle.

The vehicle lamp 10 according to one embodiment of the present disclosure includes a frame 11 fixed to a vehicle body, and a light source unit 12 installed on the frame 11.

A wiring line for supplying power to the light source unit 12 may be connected to the frame 11, and the frame 11 may be fixed to the vehicle body directly or by using a bracket. As illustrated, the vehicle lamp 10 may be provided with a lens unit to more diffuse and sharpen light emitted from the light source unit 12.

The light source unit 12 may be a flexible light source unit that can be curved, bent, twisted, folded, or rolled by an external force.

In a non-curved state of the light source unit 12 (e.g., a state having an infinite radius of curvature, hereinafter, referred to as a "first state"), the light source unit 12 is flat. When the first state is switched to a state that the light source unit 12 is bent by an external force (e.g., a state having a finite radius of curvature, hereinafter, referred to as a "second state"), the flexible light source unit may have a curved surface with at least part curved or bent.

A pixel of the light source unit 12 may be implemented by a semiconductor light-emitting element. The present disclosure exemplarily illustrates a light-emitting diode (LED) as a type of semiconductor light-emitting element for converting a current into light. The LED has a small size, thereby serving as a pixel even in the second state.

Meanwhile, the light source unit 12 according to the present disclosure includes a unit light source, a base substrate, and a connection (or connecting) electrode. Hereinafter, the above-mentioned constituent elements (components) will be described in detail.

The light source unit 12 may be provided with only the unit light source. Hereinafter, the unit light source will be described in detail based on the light source unit 12 provided with only the unit light source.

Figure 3:
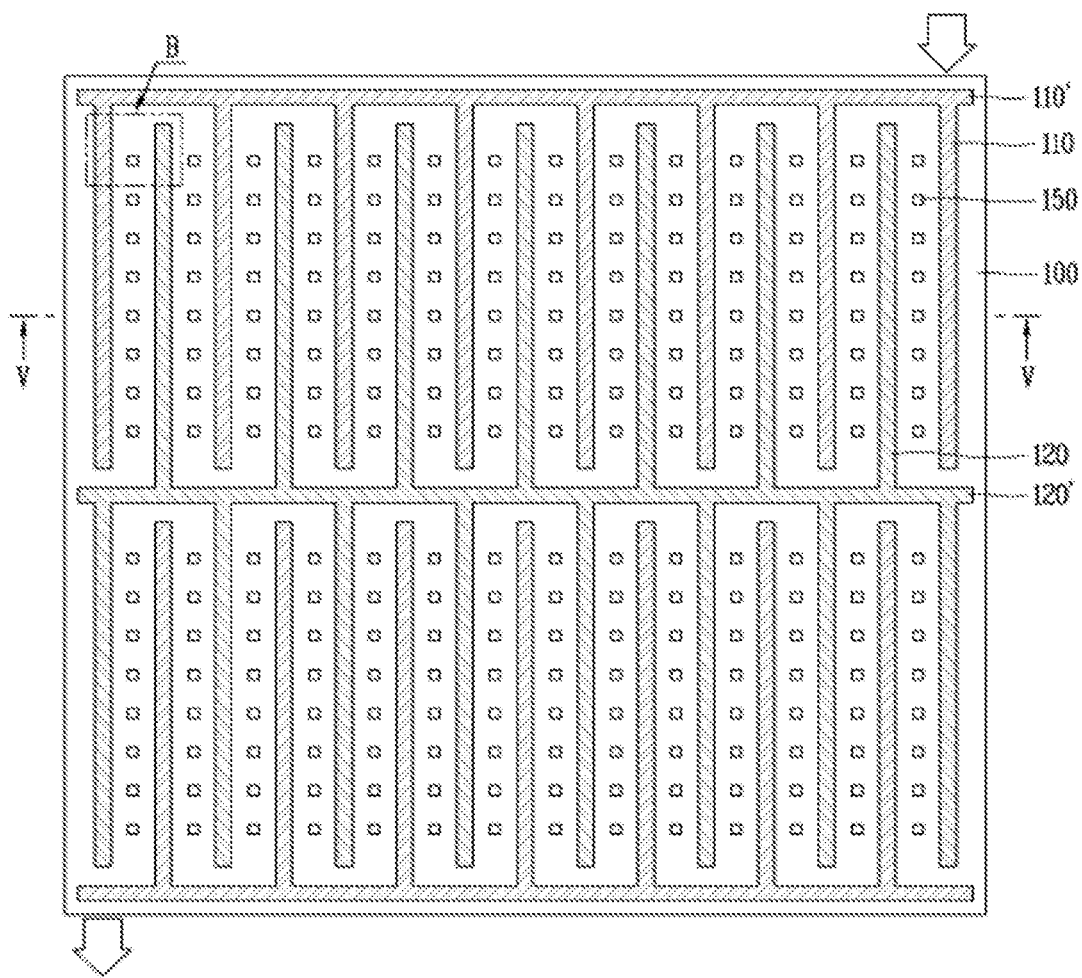
FIG. 3 is a planer view of an area A in FIG. 2.
Figure 4:
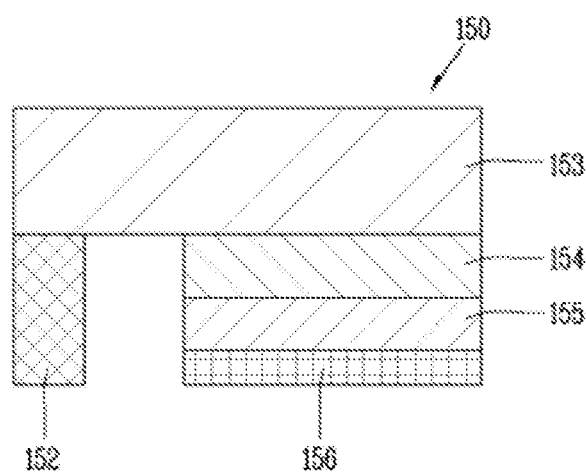
FIG. 4 is a conceptual view of a flip chip type semiconductor light-emitting element.
Figure 5:
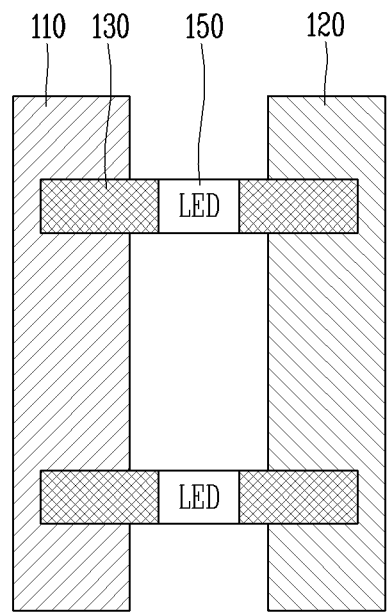
FIG. 5 is an enlarged view of an area B in FIG. 3.
Figure 6:
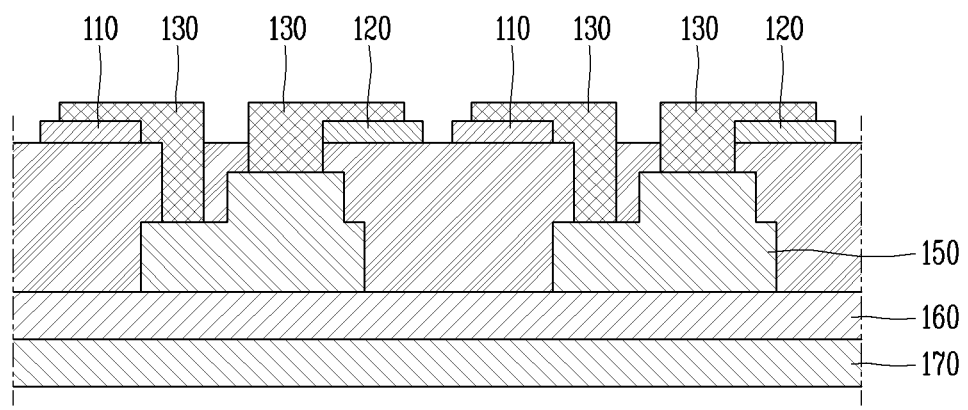
FIG. 6 is a cross-sectional view taken along line "V-V" of FIG. 3.

FIG. 3 is a planar view of an area A in FIG. 2, FIG. 4 is a conceptual view of a flip chip type semiconductor light-emitting element, FIG. 5 is an enlarged view of an area B in FIG. 3, and FIG. 6 is a cross-sectional view taken along line "V-V" of FIG. 3.

As illustrated, the light source unit 12 includes a wiring substrate 100, a first electrode line 110, a second electrode line 120, a transparent electrode 130, and a semiconductor light-emitting element 150. Hereinafter, the components will be described in detail.

Referring to FIG. 3, a plurality of electrode lines may be disposed on the wiring substrate 100. Each of the electrode lines 110 and 120 may protrude from bus electrodes 110' and 120', respectively, and extends in one direction to have a bar shape. Meanwhile, each of the electrode lines 110 and 120 has one end located opposite to the bus electrodes 110' and 120'.

When the electrode lines 110 and 120 are described as a bar, each having two ends, then one end of the electrode line is connected to the bus electrode, and another end thereof is located opposite to the bus electrode. In this specification, an intermediate point between the opposite ends of the electrode line will be referred to as a "central portion" of the electrode line.

Meanwhile, two types of bus electrodes may be disposed on the wiring board 100, namely the first and second bus electrodes 110' and 120' are provided. A voltage applied between the first and second bus electrodes 110' and 120' is applied to each of the semiconductor light-emitting elements 150. This allows each of the semiconductor light-emitting elements 150 to emit light. The first and second electrode lines 110 and 120 respectively extending from the first and second bus electrodes 110' and 120' are electrically connected to the semiconductor light-emitting elements 150, so that the voltage applied between the first and second bus electrodes 110' and 120' is applied to each of the semiconductor light-emitting elements 150.

Here, individual semiconductor light-emitting elements 150 should be electrically connected to the first and second electrode lines 110 and 120, respectively. Before discussing a structure in which the semiconductor light-emitting elements 150 are electrically connected to the electrode lines, a structure of the semiconductor light-emitting elements 150 will be described.

Referring to FIG. 4, the semiconductor light-emitting element 150 may be a flip chip type light-emitting element.

For example, the semiconductor light-emitting element 150 includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 formed on the n-type semiconductor layer 153 with being spaced apart from the p-type electrode 156 in a horizontal direction. Here, the p-type electrode 156 may be electrically connected to the first electrode line 110, and the n-type electrode 152 may be electrically connected to the second electrode line 120.

Referring to FIG. 6, in the lamp according to the present disclosure, the p-type electrode and the n-type electrode are disposed in a direction of a light emitting surface. That is, light emitted from the lamp according to the present disclosure is discharged to the outside by passing through the p-type electrode and the n-type electrode. Due to this structural feature, structures that overlap with the semiconductor light-emitting elements should be minimized to increase an amount (or quantity) of light of the lamp.

Meanwhile, in order to maximize the amount of light of the lamp, a reflective layer (or reflector) 160 may be disposed at an opposite side of a light emitting surface of the semiconductor light-emitting element 150. The reflective layer 160 reflects light emitted from the semiconductor light-emitting element 150 and directed downward of the lamp, so as to increase the amount of light of the lamp. The reflective layer 160 may be formed on a base substrate 170.

When the first and second electrode lines 110 and 120 made of metal or alloy are electrically connected to the semiconductor light-emitting element 150 in a direct manner, the amount of light of the lamp may be reduced because the first and second electrode lines 110 and 120 cover or block the light emitting surface of the semiconductor light-emitting element 150. To prevent this, each of the first and second electrode lines 110 and 120 is electrically connected to the semiconductor light-emitting element 150 through the transparent electrode 130.

The transparent electrode 130 may be made of a material having high light transmittance and conductivity. For example, the transparent electrode 130 may be Indium Tin Oxide (ITO). The transparent electrode 130 has much higher light transmittance than the first and second electrode lines 110 and 120, but has lower electrical conductivity. As illustrated in FIG. 6, when the semiconductor light-emitting element 150 overlaps the transparent electrode 130, a decrease in the amount of light of the lamp may be minimized.

Figure 7:
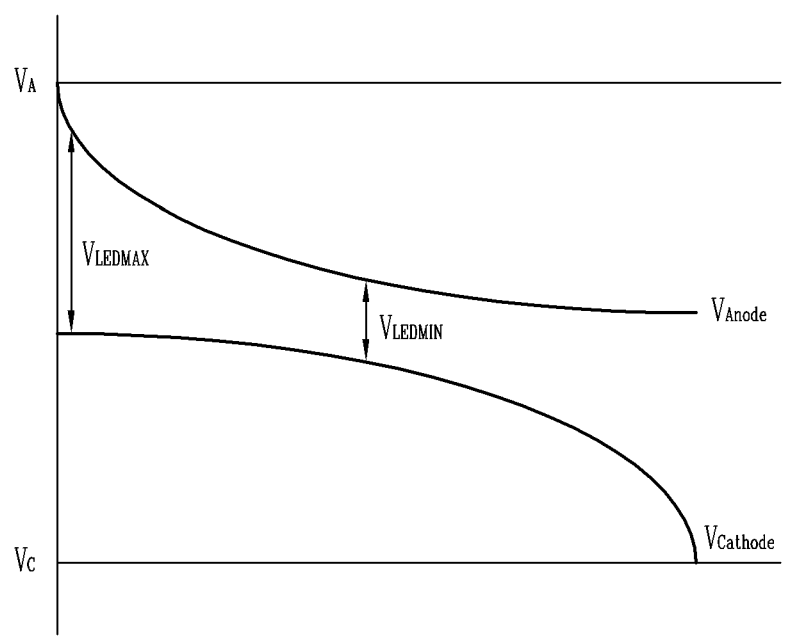
FIG. 7 is a graph showing a magnitude of voltage applied to semiconductor light-emitting elements according to a distance between bus electrodes and the semiconductor light-emitting elements in a lamp illustrated in FIG. 3.

However, electrical conductivity of the transparent electrode 130 is lower than that of the first and second electrode lines 110 and 120, a voltage drop may occur. This will be described in detail with reference to FIG. 7. FIG. 7 is a graph showing a magnitude of voltage applied to semiconductor light-emitting elements according to a distance between bus electrodes and the semiconductor light-emitting elements in a lamp illustrated in FIG. 3.

As illustrated, a voltage is gradually decreased as the semiconductor light-emitting element is further away from the first bus electrode, and is then increased again. That is, a voltage applied to semiconductor light-emitting elements adjacent to the central portion of the electrode line is lower than a voltage applied to semiconductor light-emitting elements adjacent to the opposite ends of the electrode line. Accordingly, the amount of light emitted from the semiconductor light-emitting elements varies depending on positions of the semiconductor light-emitting elements. As the area of the lamp increases, the difference in the amount of light becomes more apparent.

In order to solve this problem, which is due to a voltage drop, the present disclosure provides a structure that has uniform voltage distribution regardless of the positions of the semiconductor light-emitting elements. The lamp according to the present disclosure may include all of the components described in FIGS. 3 to 6. However, the lamp according to the present disclosure has an electrode structure different from the above-described electrode lines and the bus electrodes.

Figure 8:
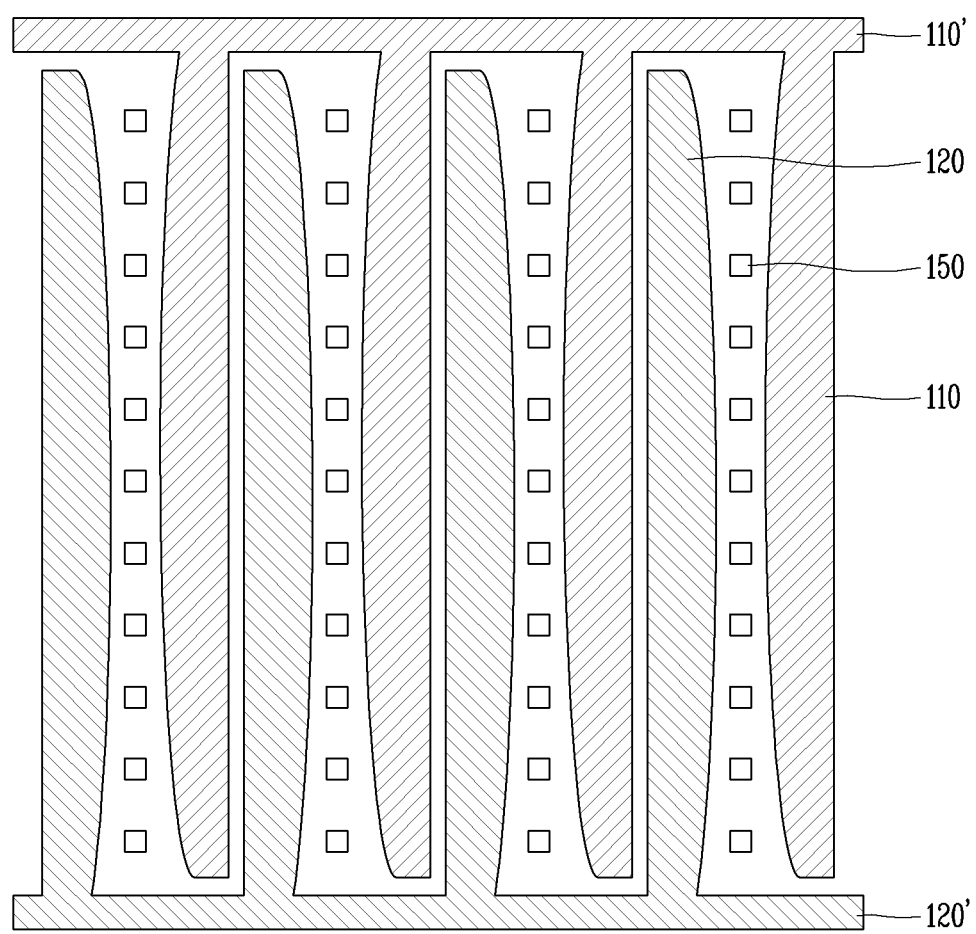
FIG. 8 is a conceptual view illustrating a lamp according to one embodiment of the present disclosure.

FIG. 8 is a conceptual view illustrating a lamp according to one embodiment of the present disclosure.

Although the transparent electrode 130 is not illustrated in FIG. 8, the first and second electrode lines 110 and 120 are electrically connected to the semiconductor light-emitting element 150 through the transparent electrode 130, as described in FIG. 5.

The lamp according to the present disclosure includes a plurality of semiconductor light-emitting elements 150. The plurality of semiconductor light-emitting elements 150 is aligned along a direction in which the electrode line is formed. Here, the semiconductor light-emitting elements 150 are disposed to be spaced apart from adjacent electrode lines by a predetermined distance. The distance between the semiconductor-light emitting elements 150 and each electrode line decreases toward the central portion of the electrode line. In contrast, the distance increases as the semiconductor light-emitting element is disposed closer to the bus electrode, or disposed closer to one end of the electrode line located opposite the bus electrode.

In one embodiment, referring to FIG. 8, a width of each of the electrode lines may increase toward the central portion of the electrode line, so that the distance between the semiconductor light-emitting elements and each of the electrode lines increases. Accordingly, the electrode line has a convex shape in a direction in which the semiconductor light-emitting elements are disposed.

Meanwhile, both the first and second electrode lines 110 and 120 may have the convex shape. When the first and second electrode lines 110 and 120 are disposed parallel to each other, and the central portions of the first and second electrode lines 110 and 120 are located on the same line, the distance between the semiconductor light-emitting elements and electrode lines decreases toward the central portions of the first and second electrode lines 110 and 120.

As the distance between the semiconductor light-emitting element and the electrode line is smaller, an amount of voltage drop is reduced. With this structure, the amount of voltage drop in the central portion of the electrode line is less than the both ends of the electrode line, allowing the same voltage to be applied to all of the semiconductor light-emitting elements provided in the lamp.

Therefore, a voltage applied to the semiconductor light-emitting elements may be controlled by adjusting the distance between the electrode lines and the semiconductor light-emitting elements. Hereinafter, another embodiment of the present disclosure will be described.

In this embodiment, a uniform voltage may be applied to the semiconductor light-emitting elements while the width of each of the electrode lines disposed on the wiring board is constant.

FIGS. 9 to 12 are conceptual views of a lamp including an electrode line having a protrusion.

Figure 9:
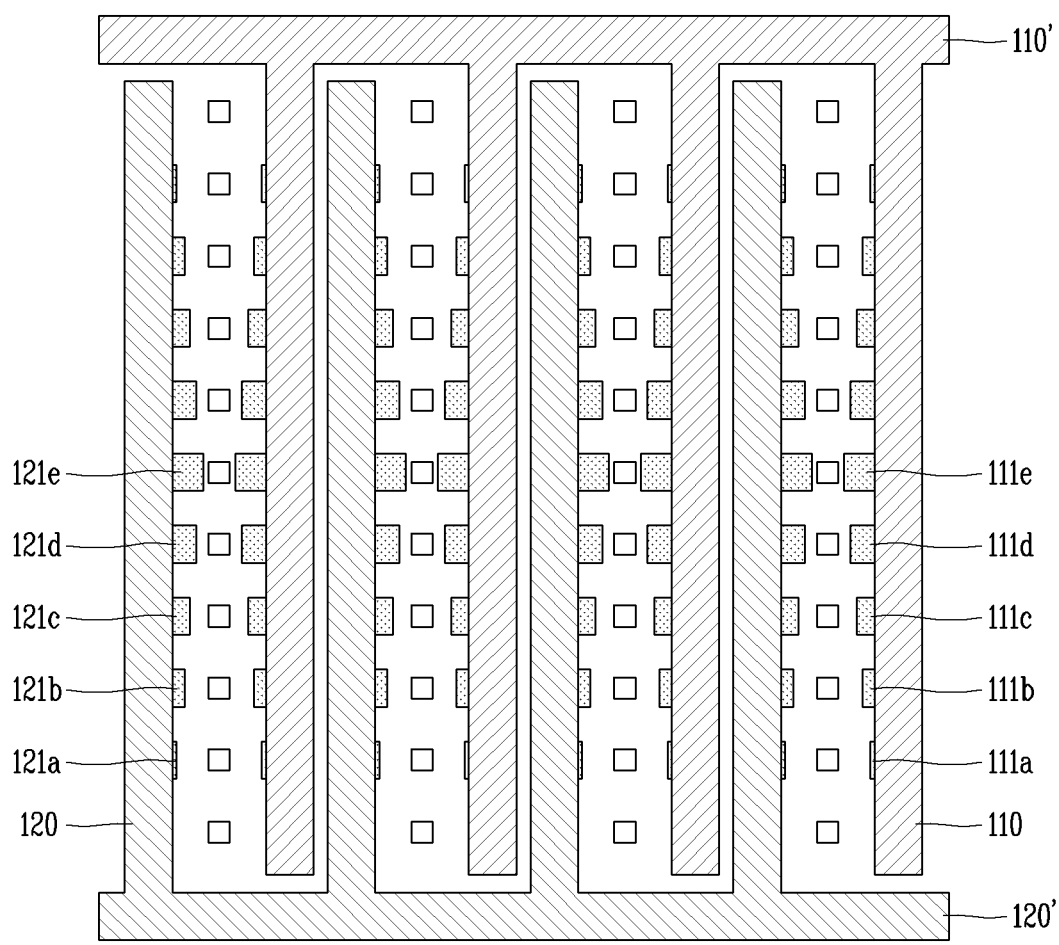
FIGS. 9 to 12 are conceptual views of a lamp including an electrode line having a protrusion.

As illustrated in FIG. 9, each of the plurality of electrode lines may be provided with protrusions (or protruding portions) 111 and 121 formed perpendicular to a direction in which the electrode line is provided. Each of the protrusions 111 and 121 protrudes in a direction in which the semiconductor light-emitting element 150 is disposed. The protrusions 111 and 121 do not overlap the semiconductor light-emitting element 150.

Figure 10:
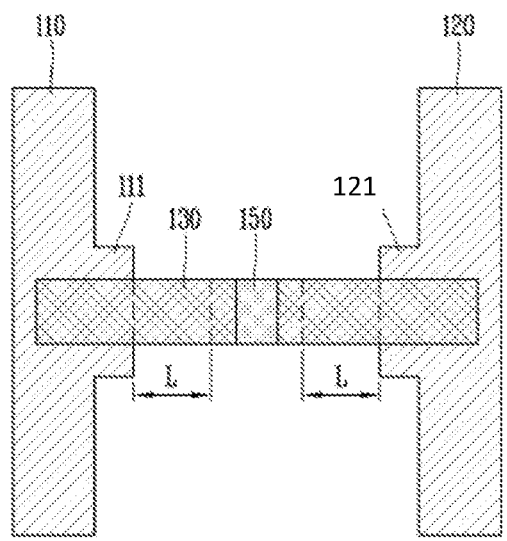

As the protrusion is made of a metal having high electrical conductivity, like the electrode line, it serves to narrow the distance between the semiconductor light-emitting element and the electrode line. As illustrated in FIG. 10, the transparent electrode 130 is provided in a direction in which the protrusions 111 and 121 protrude, so as to electrically connect the protrusions 111, 121 and the semiconductor light-emitting element 150. When the protrusion 111 and the semiconductor light-emitting element 150 are electrically connected, a substantial decrease in distance between the first electrode line 110 and the semiconductor light-emitting element 150 is achieved.

Meanwhile, as shown in FIG. 9, a length of the protrusions 111a to 111e and 121a to 121e may vary depending on their positions. In detail, the length of the protrusions may increase toward the central portion of the electrode line. Accordingly, the length of the protrusion 121e disposed at the central portion of the electrode line may be greater (or longer) than the length of the protrusion 121a located adjacent to the bus electrode. Likewise, the length of the protrusion 111e disposed at the central portion of the electrode line may be greater than the length of the protrusion 111a located adjacent to one end of the electrode line.

Figure 11:
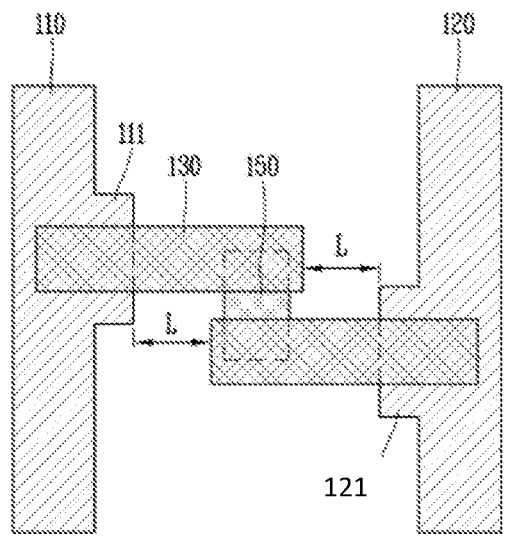

Further, as shown in FIG. 11, the protrusion 111 formed on the first electrode line 110 and the protrusion 121 formed on the second electrode line 120 are not necessarily disposed on the same line. In this case, the transparent electrodes 130 may be alternately disposed to each other, namely, a transparent electrode that electrically connects the first electrode line 110 and the semiconductor light-emitting element 150, and a transparent electrode that electrically connects the second electrode line 110 and the semiconductor light-emitting element 150 are alternately disposed.

Therefore, the protrusions of the electrode line have different lengths according to their positions. This may allow a magnitude of voltage applied to the semiconductor-light emitting elements to be uniform.

Meanwhile, in the lamp according to the present disclosure, a uniform voltage may be applied to the semiconductor light-emitting elements even when the protrusions have the same length.

Figure 12:
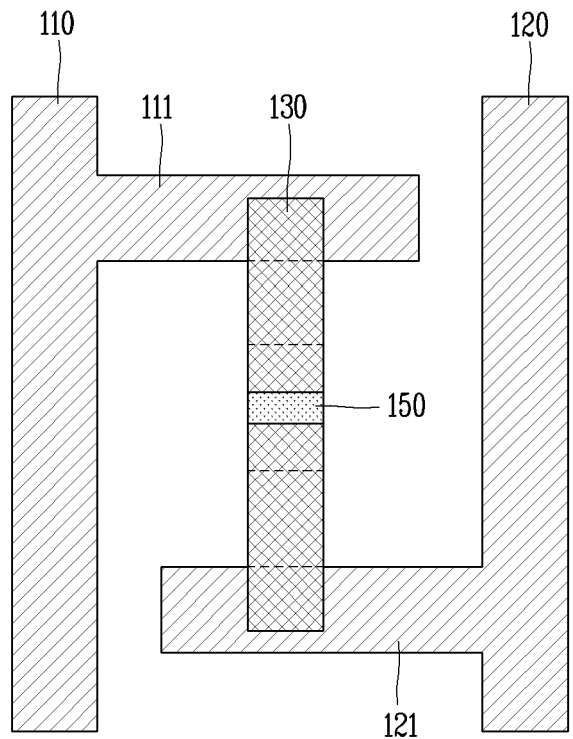

Referring to FIG. 12, the length of the protrusions 111 and 121 formed on the electrode lines 110 and 120, respectively, may be greater than the distance between the electrode line and the semiconductor light-emitting element. When the protrusion protrudes to a position where the semiconductor light-emitting element is disposed, the protrusion overlaps the semiconductor light-emitting element. To prevent this, the protrusion protrudes to a position where the semiconductor light-emitting element is not disposed.

Here, the transparent electrode 130 is electrically connected to the protrusions 111 and 121, and extends along the direction in which the electrode line is formed so as to be electrically connected to the semiconductor light-emitting element. In the structure of FIG. 12, the width of each of the protrusions 111 and 121 may increase toward the central portion of the electrode line. As the width of the protrusion is thicker, a voltage applied to the semiconductor light-emitting element may be increased. By utilizing this, the amount of voltage drop in the central portion of the electrode line may be reduced.

Figure 13:
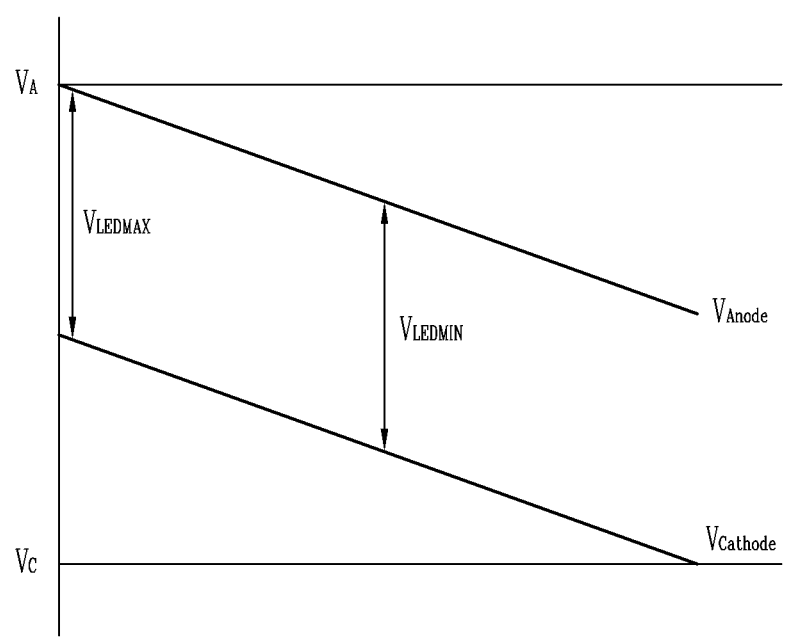
FIG. 13 is a graph showing a magnitude of voltage applied to semiconductor light-emitting elements according to a distance between bus electrodes and the semiconductor light-emitting elements in the lamp according to the present disclosure.

According to the structures described with reference to FIGS. 8 to 12, the same voltage may be applied regardless of the position of the semiconductor light-emitting element. More specifically, as shown in a graph of FIG. 13, a voltage difference between Vanode (or anode voltage) and Vcathode (or cathode voltage) may be constantly maintained by using the structures of the present disclosure. This may allow light uniformity of the lamp to be improved.

Meanwhile, the lamp according to the present disclosure may apply a uniform voltage to the semiconductor light-emitting elements through arrangement of the bus electrode.

Figure 14:
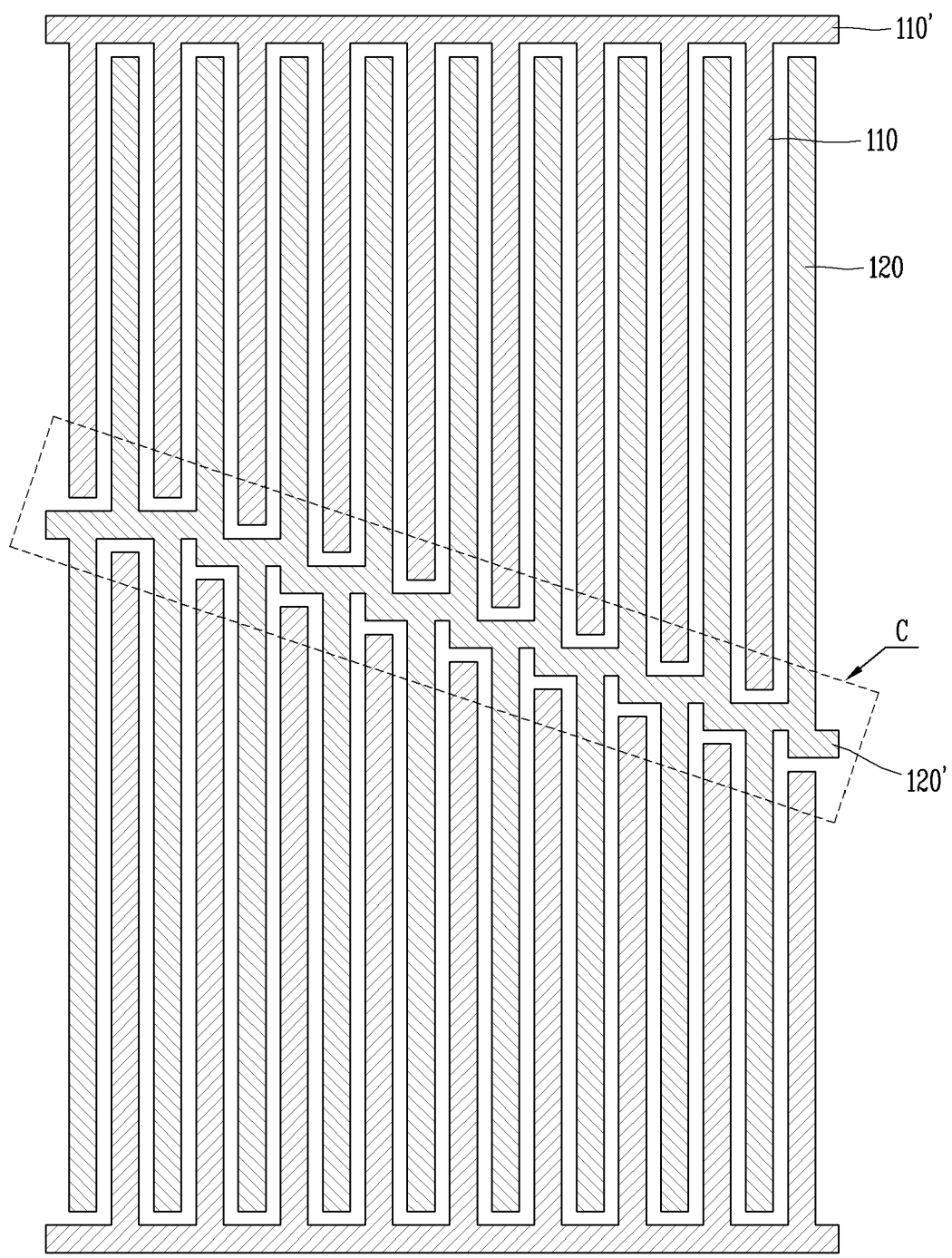
FIG. 14 is a conceptual view illustrating an electrode structure of the lamp according to the present disclosure.

FIG. 14 is a conceptual view illustrating an electrode structure of the lamp according to the present disclosure.

As illustrated in FIG. 14, a second bus electrode 120' may be inclined with respect to the first bus electrode 110'. In detail, as illustrated in an area "C", the second bus electrode 120' may be obliquely formed in a direction that the first bus electrode 110' is provided, thereby adjusting the amount of voltage drop within the lamp.

Here, the first electrode line 110 protrudes perpendicularly (or vertically) from the first bus electrode 110', whereas the second electrode line 120 inclinedly protrudes from the second bus electrode 120'.

In the electrode structure of FIG. 14, when the semiconductor light-emitting element is disposed between the first and second electrode lines 110 and 120, a uniform voltage may be applied to the semiconductor light-emitting elements. This may allow light uniformity of the lamp to be increased.

As described above, according to the present disclosure, as a uniform voltage is applied to the semiconductor light-emitting elements provided in the lamp, each of the semiconductor light-emitting elements provided in the lamp may emit light with the same brightness.

The aforementioned lamp using the semiconductor light-emitting elements is not limited to the configuration and the method of the embodiments described above, but the embodiments may be configured such that all or some of the embodiments are selectively combined so that various modifications can be made.

The invention claimed is:

1. A lamp, comprising:
   a wiring substrate;
   a bus electrode provided on the wiring substrate;
   a plurality of electrode lines provided on the wiring substrate, and extending from the bus electrode, each electrode line having one end and a central portion located between the one end and the bus electrode;
   a plurality of semiconductor light-emitting elements aligned along an extending direction of the plurality of electrode lines, and disposed to be spaced apart from adjacent electrode lines of the plurality of electrode lines by varying distances, respectively; and
   a plurality of transparent electrodes that respectively provide an electrical connection between the plurality of electrode lines and the plurality of semiconductor light-emitting elements,
   wherein the respective varying distances between the plurality of semiconductor light-emitting elements and each of the adjacent electrode lines decrease toward the central portion of the each electrode line.

2. The lamp of claim 1, wherein the respective varying distances between each of the adjacent electrode lines and the plurality of semiconductor light-emitting elements increase toward the bus electrode or the one end.

3. The lamp of claim 2, wherein a width of each of the plurality of electrode lines increases toward the central portion of the each electrode line.

4. The lamp of claim 1, wherein each of the plurality of electrode lines includes a plurality of protrusions protruding in a direction different from the extending direction of the plurality of electrode lines.

5. The lamp of claim 4, wherein a length of each of the plurality of protrusions increases toward the central portion of the each electrode line.

6. The lamp of claim 5, wherein the plurality of transparent electrodes are electrically connected to the plurality of protrusions, respectively, and extend in a protruding direction of the plurality of protrusions so as to be electrically connected to the plurality of semiconductor light-emitting elements, respectively.

7. The lamp of claim 4, wherein a length of each of the plurality of protrusions is greater than the respective varying distances between each of the adjacent electrode lines and the plurality of semiconductor light-emitting elements.

8. The lamp of claim 7, wherein the plurality of transparent electrodes are electrically connected to the plurality of protrusions, respectively, and extend in the extending direction of the plurality of electrode lines so as to be electrically connected to the plurality of semiconductor light-emitting elements, respectively.

9. The lamp of claim 1, wherein the bus electrode includes a first bus electrode and a second bus electrode, and
wherein the first bus electrode and the second bus electrode are inclined with respect to each other.

10. The lamp of claim 9, wherein the plurality of electrode lines include a first electrode line extending from the first bus electrode and a second electrode line extending from the second bus electrode, and
wherein the first electrode line protrudes in a direction perpendicular to the first bus electrode, and the second electrode line protrudes in a direction inclined to the second bus electrode.

11. The lamp of claim 10, wherein the first electrode line applies an anode voltage to the plurality of semiconductor light-emitting elements, and the second electrode line applies a cathode voltage to the plurality of semiconductor light-emitting elements, and
wherein a voltage difference between the anode voltage and the cathode voltage applied to each of the plurality of semiconductor light-emitting elements is constant regardless of a location of each semiconductor light-emitting element on the wiring substrate.

12. The lamp of claim 4, wherein the plurality of protrusions of the adjacent electrode lines extend toward the plurality of semiconductor light-emitting elements, respectively.

13. The lamp of claim 12, wherein the plurality of protrusions of one of the adjacent electrode lines are exactly aligned to the plurality of protrusions of the other of the adjacent electrode lines.

14. The lamp of claim 12, wherein the plurality of protrusions of one of the adjacent electrode lines are offset to the plurality of protrusions of the other of the adjacent electrode lines.

15. The lamp of claim 1, wherein the plurality of semiconductor light-emitting elements are disposed between the adjacent electrode lines.

16. A lighting device, comprising:
a wiring substrate;
a plurality of first electrode lines provided on the wiring substrate, and a first bus connected to the plurality of first electrode lines;
a plurality of second electrode lines provided on the wiring substrate, and a second bus connected to the plurality of second electrode lines;
a plurality of semiconductor light-emitting elements disposed between adjacent pairs of and second electrode lines,
wherein the plurality of first electrode lines and the plurality of second electrode lines are interdigitated, and
wherein the adjacent pairs of first and second electrode lines each has a middle portion that face each other, and is closer to each other than remaining portions of the adjacent pairs of first and second electrode lines.

17. The lighting device of claim 16, wherein the middle portion is a curved bulge.

18. The lighting device of claim 17, wherein respective curved bulges of the adjacent pairs of first and second electrode lines are exactly aligned.

19. The lighting device of claim 16, wherein the middle portion is a series of protrusions.

20. The lighting device of claim 16, wherein the plurality of first electrode lines apply an anode voltage to the plurality of semiconductor light-emitting elements, and the plurality of second electrode lines apply a cathode voltage to the plurality of semiconductor light-emitting elements, and
wherein a voltage difference between the anode voltage and the cathode voltage applied to each of the plurality of semiconductor light-emitting elements is constant regardless of a location of each semiconductor light-emitting element on the wiring substrate.

* * * * *